United States Patent
Abe et al.

(10) Patent No.: US 11,342,447 B2
(45) Date of Patent: May 24, 2022

(54) SPUTTERING TARGET FOR INSULATING OXIDE FILM, METHOD FOR FORMING INSULATING OXIDE FILM, AND METHOD FOR PRODUCING FIELD-EFFECT TRANSISTOR

(71) Applicant: Ricoh Company, Ltd., Tokyo (JP)

(72) Inventors: Yukiko Abe, Kanagawa (JP); Yuki Nakamura, Tokyo (JP); Shinji Matsumoto, Kanagawa (JP); Yuji Sone, Kanagawa (JP); Naoyuki Ueda, Kanagawa (JP); Ryoichi Saotome, Kanagawa (JP); Minehide Kusayanagi, Kanagawa (JP)

(73) Assignee: RICOH COMPANY, LTD., Tokyo (JP)

(*) Notice: Subject to any disclaimer, the term of this patent is extended or adjusted under 35 U.S.C. 154(b) by 15 days.

(21) Appl. No.: 16/697,770

(22) Filed: Nov. 27, 2019

(65) Prior Publication Data

US 2020/0176588 A1 Jun. 4, 2020

(30) Foreign Application Priority Data

Nov. 30, 2018 (JP) .............................. JP2018-224484

(51) Int. Cl.
*H01L 29/66* (2006.01)
*C23C 14/34* (2006.01)
*H01L 21/02* (2006.01)

(52) U.S. Cl.
CPC .... *H01L 29/66742* (2013.01); *C23C 14/3421* (2013.01); *H01L 21/02175* (2013.01); *H01L 21/02266* (2013.01)

(58) Field of Classification Search
CPC ......... H01L 21/02175; H01L 21/02194; H01L 21/02266; H01L 29/4908; H01L 29/66742; H01L 29/66969; H01L 29/7869; C23C 14/0042; C23C 14/083; C23C 14/3414; C23C 14/3421
See application file for complete search history.

(56) References Cited

U.S. PATENT DOCUMENTS

| | | | |
|---|---|---|---|
| 10,008,181 B2 | 6/2018 | Saotome et al. | |
| 10,020,374 B2* | 7/2018 | Sone | H01L 29/7881 |
| 10,235,930 B2 | 3/2019 | Saotome et al. | |
| 10,269,293 B2 | 4/2019 | Saotome et al. | |
| 2004/0001995 A1* | 1/2004 | Furuya | H01M 8/1246 429/496 |
| 2012/0049297 A1* | 3/2012 | Takeoka | H01L 21/823462 257/410 |
| 2013/0285336 A1* | 10/2013 | Ito | H01B 1/08 279/128 |
| 2017/0162172 A1* | 6/2017 | Saotome | H01L 27/1225 |

(Continued)

FOREIGN PATENT DOCUMENTS

JP 2011-151370 8/2011

*Primary Examiner* — Mohammed Shamsuzzaman
(74) *Attorney, Agent, or Firm* — Xsensus LLP

(57) ABSTRACT

A sputtering target for an insulating oxide film, the sputtering target including a sintered body including a lanthanum oxide and at least one selected from the group consisting of a beryllium oxide, a magnesium oxide, a calcium oxide, a strontium oxide, and a barium oxide, wherein lanthanum has highest molar ratio among elements other than oxygen contained in the sintered body.

4 Claims, 3 Drawing Sheets

(56) References Cited

U.S. PATENT DOCUMENTS

| | | |
|---|---|---|
| 2017/0271381 A1 | 9/2017 | Sone et al. |
| 2018/0277060 A1 | 9/2018 | Saotome et al. |
| 2018/0331196 A1 | 11/2018 | Sone et al. |
| 2018/0358236 A1 | 12/2018 | Arae et al. |

* cited by examiner

SPUTTERING TARGET FOR INSULATING OXIDE FILM, METHOD FOR FORMING INSULATING OXIDE FILM, AND METHOD FOR PRODUCING FIELD-EFFECT TRANSISTOR

CROSS-REFERENCE TO RELATED APPLICATIONS

The present application claims priority under 35 U.S.C. § 119 to Japanese Patent Application No. 2018-224484, filed Nov. 30, 2018. The contents of which are incorporated herein by reference in their entirety.

BACKGROUND OF THE INVENTION

Field of the Invention

The present disclosure relates to a sputtering target for an insulating oxide film, a method for forming an insulating oxide film, and a method for producing a field-effect transistor.

Description of the Related Art

Liquid crystal displays (LCDs), organic EL (electroluminescence) displays (OLEDs), flat panel displays (FPDs) such as electronic paper are driven by a drive circuit including a thin film transistor (TFT) in which an amorphous silicon or polycrystal silicon is used in an active layer. In addition, FPDs are required to have a larger size, higher definition, and driving performance at a high speed. Therefore, required characteristics of transistors are increasing from year to year.

Examples of the materials used for a semiconductor layer of the transistor include amorphous silicon (a-Si), polycrystal silicon (particularly, low-temperature poly silicon: LTPS), and oxide semiconductors represented by In-Ga-Zn-O (IGZO)-based materials. Among them, the oxide semiconductors can be adapted to a screen having a larger size and driving performance at a high speed because they exhibit larger electron field-effect mobility by one digit or more than a-Si, and are expected to enable film formation at room temperature through sputtering to thereby save cost compared to LTPS formed through complex steps. Therefore, development of the oxide semiconductors is actively performed in recent years.

As a gate insulating layer of the transistor, a film of $SiO_2$ or SiON formed through the chemical vapor deposition (CVD) is industrially used.

In order to meet demands for further highly integrated transistors and displays consuming less electric power, technique using a so-called high-k insulating film, which has a remarkably higher relative dielectric constant than $SiO_2$, as a gate insulating layer of the transistor has been proposed in recent years.

For example, Japanese Unexamined Patent Application Publication No. 2011-151370 proposes an amorphous complex metal oxide insulating film including one or more elements selected from the group consisting of alkali-earth metals and one or more elements selected from the group consisting of Ga, Sc, Y, and lanthanoids excluding Ce. However, details of a method for forming this oxide insulating film through sputtering process that is low cost and has a high versatility have not been disclosed.

SUMMARY OF THE INVENTION

A means for solving the aforementioned object is as follows, for example.

According to one aspect of the present disclosure, a sputtering target for an insulating oxide film includes a sintered body including a lanthanum oxide and at least one selected from the group consisting of a beryllium oxide, a magnesium oxide, a calcium oxide, a strontium oxide, and a barium oxide.

Lanthanum has highest molar ratio among elements other than oxygen contained in the sintered body.

Figure 1:
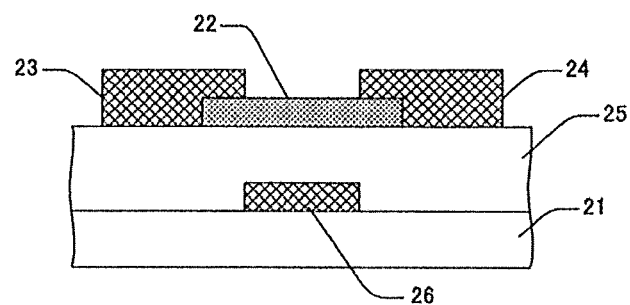
FIG. 1 is a schematic cross-sectional view presenting one example of a top contact-bottom gate field-effect transistor.

DESCRIPTION OF THE EMBODIMENTS (Sputtering Target for Insulating Oxide Film)

A sputtering target of the present disclosure for an insulating oxide film (may be referred to as "target") includes a sintered body.

The sintered body includes at least a lanthanum oxide and at least one selected from the group consisting of a beryllium oxide, a magnesium oxide, a calcium oxide, a strontium oxide, and a barium oxide, and preferably includes at least one selected from the group consisting of an aluminum oxide, a titanium oxide, a zirconium oxide, a hafnium oxide, a niobium oxide, and a tantalum oxide.

In the target, lanthanum (La) has the highest molar ratio among elements other than oxygen contained in the sintered body.

An object of the present disclosure is to provide a sputtering target for an insulating oxide film that can form an insulating oxide film having a high dielectric constant and an excellent insulating property, and hardly forms powder.

According to the present disclosure, it is possible to provide a sputtering target for an insulating oxide film that can form an insulating oxide film having a high dielectric constant and an excellent insulating property, and hardly forms powder.

The lanthanum oxide has a high dielectric constant and an excellent insulating property, and thus is suitable for a gate insulating film of a transistor. An insulating film of the lanthanum oxide is required to be formed through a sputtering process that is lower cost (compared to CVD) and has a high versatility. However, when a sputtering target is prepared with a lanthanum oxide, the lanthanum oxide absorbs moisture in the air to thereby form hydroxide, and then powder is gradually formed on the surface of the target. As a result, it cannot be used as a target.

The present inventors have found that the sintered body including at least one selected from the group consisting of a beryllium oxide, a magnesium oxide, a calcium oxide, a strontium oxide, and a barium oxide in addition to a lanthanum oxide makes it possible to form a sputtering target that does not form powder. In addition, the present inventors have found that when lanthanum has the highest molar ratio among elements other than oxygen, an insulating oxide film formed from this target can be a film having a high dielectric constant and an excellent insulating property.

<Sintered Body>

The sintered body includes at least a lanthanum oxide ($La_2O_3$) and at least one selected from the group consisting of a beryllium oxide, a magnesium oxide, a calcium oxide, a strontium oxide, and a barium oxide, and preferably includes at least one selected from the group consisting of an aluminum oxide, a titanium oxide, a zirconium oxide, a hafnium oxide, a niobium oxide, and a tantalum oxide.

In the target, a ratio of moles of lanthanum to a total of moles of the elements other than oxygen contained in the sintered body is preferably 95% or less. This makes it possible to form less powder on the surface of the target, resulting in further prolonged life time of the target.

In the target, the ratio of the moles of lanthanum to the total of moles of the elements other than oxygen contained in the sintered body is preferably 40% or more. As a result, an insulating oxide film formed from the target can be a film having a high dielectric constant and a high resistance to voltage.

<< At Least One Selected from the Group Consisting of Beryllium Oxide, Magnesium Oxide, Calcium Oxide, Strontium Oxide, and Barium Oxide>>

Examples of the at least one selected from the group consisting of a beryllium oxide, a magnesium oxide, a calcium oxide, a strontium oxide, and a barium oxide include beryllium oxide (BeO), magnesium oxide (MgO), calcium oxide (CaO), strontium oxide (SrO), and barium oxide (BaO).

These may be used alone or in combination.

In the target, a ratio of moles of at least one selected from the group consisting of beryllium, magnesium, calcium, strontium, and barium to a total of moles of the elements other than oxygen contained in the sintered body is preferably 1% or more but 40% or less, more preferably 2% or more but 30% or less, particularly preferably 5% or more but 20% or less. Such a formulation makes it possible to prevent moisture absorption to thereby further increase stability of the sintered body.

<< At Least One Selected from the Group Consisting of Aluminum Oxide, Titanium Oxide, Zirconium Oxide, Hafnium Oxide, Niobium Oxide, and Tantalum Oxide>>

Examples of the at least one selected from the group consisting of an aluminum oxide, a titanium oxide, a zirconium oxide, a hafnium oxide, a niobium oxide, and a tantalum oxide include aluminum oxide ($Al_2O_3$), titanium oxide ($TiO_2$), zirconium oxide ($ZrO_2$), hafnium oxide ($HfO_2$), niobium oxide ($Nb_2O_5$), and tantalum oxide ($Ta_2O_5$).

These may be used alone or in combination.

Inclusion of the at least one selected from the group consisting of an aluminum oxide, a titanium oxide, a zirconium oxide, a hafnium oxide, a niobium oxide, and a tantalum oxide in the sintered body makes it possible to increase resistance to voltage of an insulating oxide film formed from the target.

In the target, a ratio of moles of at least one selected from the group consisting of aluminum, titanium, zirconium, hafnium, niobium, and tantalum to a total of moles of the elements other than oxygen contained in the sintered body is preferably 1% or more but 50% or less, more preferably 5% or more but 45% or less, particularly preferably 10% or more but 40% or less. Such a formulation makes it possible to prevent moisture absorption to thereby further increase stability of the sintered body, and to further increase resistance to voltage of an insulating oxide film formed from this target.

A size and a shape of the sintered body are not particularly limited and may be appropriately selected depending on the intended purpose.

A relative density of the sintered body is not particularly limited and may be appropriately selected depending on the intended purpose. However, the relative density thereof is preferably 90% or more, more preferably 95% or more. The relative density is a value that represents, the density of a sintered body as a ratio when the density calculated from specific gravities of oxides contained in the sintered body is regarded as 100%. When the relative density is less than 90%, strength of the sintered body may be decreased to be brittle. When the relative density is 90% or more, more efficient sputtering process can be performed and generation of particles during the sputtering can be prevented, which makes it possible to form an insulating film having good quality.

<Method for Producing Target>

A method for producing the target is not particularly limited and may be appropriately selected depending on the intended purpose. Examples thereof include the following method.

Raw material powders are mixed at a desired ratio. When the raw material powders are oxide, a mixture of the raw material powders is ground with, for example, a ball mill, and is molded into a target, followed by baking. Preferably, when the raw material powders are not oxide, the raw material powders are heated for synthesis in an oxidative atmosphere and are ground, and the resultant is molded into a target, followed by baking.

The baking is preferably performed at a temperature of from 1,300° C. through 1,600° C. through, for example, a hot-press method. These conditions are appropriately set so that a sintered body that is compact and has no segregation of elements can be formed, and the conditions are not limited to the conditions described herein.

The raw material powder is not particularly limited and may be appropriately selected depending on the intended purpose, so long as it includes a predetermined element. Examples thereof include oxides and carbonates.

The raw material powder preferably has high purity. The raw material powder preferably has purity of 99.9% (3N) or more, more preferably 99.99% (4N) or more, particularly preferably purity of 99.999% (5N) or more. The reason for this is because when conductive impurities exist, an insulating oxide film formed from this target causes leakage and is deteriorated in resistance to voltage.

(Method for Forming Insulating Oxide Film)

A method of the present invention for forming an insulating oxide film includes an insulating oxide film through a sputtering method using a sputtering target of the present invention for an insulating oxide film.

In the method for forming an insulating oxide film, the insulating oxide film is preferably formed by disposing the sputtering target for an insulating oxide film in a vacuum chamber, introducing, into the vacuum chamber, sputtering gas that includes oxygen and argon (Ar) and satisfies an oxygen flow ratio (flow ratio by volume) of $0\% < O_2/(Ar+O_2) \leq 90\%$, and sputtering the sputtering target for an insulating oxide film with plasma of the sputtering gas.

When the sputtering gas having an oxygen flow ratio [flow ratio by volume: $O_2/(Ar+O_2)$] of more than 0% is used, it is possible to prevent a decrease in the insulating property caused by lacking oxygen in the insulating oxide film.

When the sputtering gas having an oxygen flow ratio [flow ratio by volume: $O_2/(Ar+O_2)$] of 90% or less is used, it is possible to prevent an extremely prolonged time for film formation caused by drastically decreasing a film formation rate.

A pressure in the chamber is not particularly limited and may be appropriately selected depending on the intended purpose. The pressure is preferably 1.5 Pa or less, more preferably 1 Pa or less, particularly preferably 0.5 Pa or less. The reason for this is because as the pressure is lower, an insulating oxide film that is compact and has a high density can be obtained.

Other conditions in the sputtering method are not particularly limited and may be appropriately selected depending on the intended purpose.

A thickness, a size, a shape of the insulating oxide film formed are not particularly limited and may be appropriately selected depending on the intended purpose.

The thus-formed insulating oxide film is particularly suitably used in a gate insulating film of a field-effect transistor where an oxide semiconductor is a semiconductor layer.

In the method for forming the insulating oxide film, for example, a sputtering apparatus (CFS-4EP-LL, available from SHIBAURA MECHATRONICS CORPORATION) is used.

Figure 5:
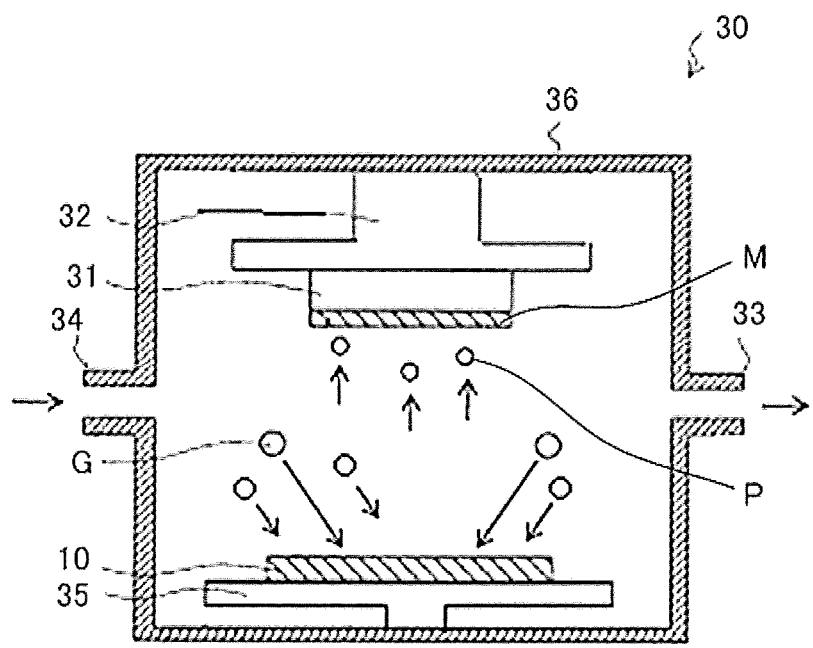
FIG. 5 is a longitudinal cross-sectional view of a sputtering apparatus in which a sputtering target of a gate insulating film is mounted.

FIG. 5 is a longitudinal cross-sectional view of a sputtering apparatus 30 according to one embodiment of the present disclosure in which a sputtering target 10 of a gate insulating film is mounted.

As presented in FIG. 5, the sputtering apparatus 30 includes a chamber 36. A substrate holder 32 is provided at the upper part in the chamber 36, and a substrate 31 on which a film is to be formed is held so that a surface on which a film is to be formed faces downward. A target holder 35 is provided at the bottom part in the chamber 36, and the sputtering target 10 is held so that a surface of the sputtering target 10 to be sputtered faces upward in a manner that the sputtering target 10 faces a surface of the substrate 31 on which the film is to be formed. Note that, it is possible to hold a plurality of substrates in the sputtering apparatus 30 and to treat these substrates 31 at a time.

A gas-introducing port 34 is coupled to one surface of the chamber 36, and a discharging port 33 is coupled to the other surface facing the gas-introducing port 34. A gas-supplying system, which is not illustrated and is configured to supply inert gas such as argon (Ar) gas into the chamber 36, is coupled to the gas-introducing port 34. A gas-discharging system, which is not illustrated and is configured to discharge gas of an atmosphere in the chamber 36, is coupled to the discharging port 33.

When a film is formed on the substrate 31 in the sputtering apparatus 30, gas such as Ar gas is supplied into the vacuum chamber 36, the earth connection is applied to the sputtering target 10, and then DC power electrically discharged is charged into the chamber 36 so that positive high voltage is applied to the substrate 31.

As a result, plasma is generated between the sputtering target material 10 and the substrate 31, and positive argon ($Ar^+$) ions G collide with the surface of the sputtering target material 10 to be sputtered. The collision of the $Ar^+$ ions G causes sputtering particles P expelled from the sputtering target material 10 to be deposited on the surface of the substrate 31 on which the film is to be formed, to thereby form an insulating film M on the substrate 31.

(Method for Producing Field-Effect Transistor)

A method of the present disclosure for producing a field-effect transistor includes at least a gate insulating film forming step, preferably includes a semiconductor layer forming step, and further includes other steps if necessary.

The field-effect transistor includes at least a gate insulating film, preferably includes a semiconductor layer, and further includes other components such as a gate electrode, a source electrode, and a drain electrode if necessary.

<Gate Insulating Film Forming Step>

The gate insulating film forming step is not particularly limited and may be appropriately selected depending on the intended purpose, so long as it is a step of forming the gate insulating film formed of an insulating oxide film through the method of the present disclosure for forming an insulating oxide film.

Use of the method of the present disclosure for forming an insulating oxide film in the gate insulating film forming step makes it possible to form a good boundary between the insulating oxide film and the semiconductor layer that is an oxide semiconductor. As a result, a field-effect transistor having a low off-current and high performances can be obtained.

<Step of Forming Semiconductor Layer (Part 1)>

The method for producing a field-effect transistor preferably includes a semiconductor layer forming step of forming the semiconductor layer formed of an oxide semiconductor through the sputtering method. This makes it possible to form the semiconductor layer and the gate insulating film through the same sputtering process.

Moreover, in the gate insulating film forming step, preferably, the gate insulating film is formed on the semiconductor layer, and after the semiconductor layer forming step, the gate insulating film forming step is performed without exposing the semiconductor layer to an atmosphere. This enables a process of stacking a gate insulating film without exposing, to an atmosphere, the semiconductor layer that has been previously formed.

Use of such a step can prevent pollution between the semiconductor layer and the gate insulating film and can prevent adsorption of oxygen or moisture on the surface of the semiconductor layer before formation of the gate insulating film, which makes it possible to further stabilize characteristics of the field-effect transistor.

The conditions of the sputtering method are not particularly limited and may be appropriately selected depending on the intended purpose.

<Step of Forming Semiconductor Layer (Part 2)>

The method for producing a field-effect transistor preferably includes a semiconductor layer forming step of forming the semiconductor layer formed of an oxide semiconductor on the gate insulating film through a sputtering method. This makes it possible to form the gate insulating film and the semiconductor layer through the same sputtering process.

Moreover, after the gate insulating film forming step, the semiconductor layer forming step is preferably performed without exposing the gate insulating film to an atmosphere. This enables a process of stacking a semiconductor layer without exposing, to an atmosphere, the gate insulating film that has been previously formed.

Use of such a step can prevent pollution between the gate insulating film and the semiconductor layer and can prevent adsorption of oxygen or moisture on the surface of the gate insulating film before formation of the semiconductor layer, which makes it possible to further stabilize characteristics of the field-effect transistor.

The conditions of the sputtering method are not particularly limited and may be appropriately selected depending on the intended purpose.

<<Gate Electrode>>

The gate electrode is in contact with, for example, the gate insulating film and faces the semiconductor layer via the gate insulating film.

The gate electrode is not particularly limited and may be appropriately selected depending on the intended purpose, so long as the gate electrode is an electrode to which gate voltage is to be applied in the field-effect transistor.

A material of the gate electrode is not particularly limited and may be appropriately selected depending on the intended purpose. Examples thereof include metals such as Mo, Ti, Al, Au, Ag, and Cu and alloys thereof; transparent conductive oxides such as indium tin oxide (ITO) and antimony-doped tin oxide (ATO); and organic conductors such as polyethylenedioxythiophene (PEDOT) and polyaniline (PANI).

—Method for Forming Gate Electrode—

The method for forming a gate electrode is not particularly limited and may be appropriately selected depending on the intended purpose. Examples of the method include (i) a method for forming a gate electrode by forming a film through, for example, the sputtering method or the clip coating method and then patterning the film through photolithography; and (ii) a method for forming a gate electrode by directly forming a film having a desired pattern through the printing process, such as inkjet printing, nanoimprinting, or gravure printing.

An average film thickness of the gate electrode is not particularly limited and may be appropriately selected depending on the intended purpose. However, the average film thickness thereof is preferably from 20 nm through 1 μm, more preferably from 50 nm through 300 nm.

<<Source Electrode and Drain Electrode>>

The source electrode and the drain electrode are not particularly limited and may be appropriately selected depending on the intended purpose, so long as they are electrodes configured to take electric current out from the field-effect transistor.

A material of the source electrode and a material of the drain electrode are not particularly limited and may be appropriately selected depending on the intended purpose. Examples thereof include: metals such as Mo, Al, Au, Ag, and Cu and alloys thereof; transparent conductive oxides such as indium tin oxide (ITO) and antimony-doped tin oxide (ATO); and organic conductors such as polyethylenedioxythiophene (PEDOT) and polyaniline (PANI).

—Method for Forming Source Electrode and Drain Electrode—

A method for forming the source electrode and the drain electrode is not particularly limited and may be appropriately selected depending on the intended purpose. Examples of the method include (i) a method for forming the source electrode and the drain electrode by forming a film through, for example, the sputtering method or the dip coating method and then patterning the film through photolithography; and (ii) a method for forming the source electrode and the drain electrode by directly forming a film having a desired pattern through the printing process, such as inkjet printing, nanoimprinting, or gravure printing.

An average film thickness of the source electrode and the drain electrode is not particularly limited and may be appropriately selected depending on the intended purpose. However, the average film thickness thereof is preferably from 20 nm through 1 μm, more preferably from 50 nm through 300 nm.

<<Semiconductor Layer>>

The semiconductor layer is disposed adjacent to, for example, the source electrode and the drain electrode.

The semiconductor layer includes a channel formation region, a source region, and a drain region. The source region is in contact with the source electrode. The drain region is in contact with the drain electrode. Specific resistances of the source region and the drain region are preferably lower than that of the channel formation region.

A material of the semiconductor layer is not particularly limited and may be appropriately selected depending on the intended purpose. Examples thereof include silicon semiconductors and oxide semiconductors.

Examples of the silicon semiconductor include amorphous silicon and polycrystal silicon.

Examples of the oxide semiconductor include InGa—Zn—O, In—Zn—O, and In—Mg—O.

Among them, oxide semiconductors are preferable.

—Method for Forming Semiconductor Layer—

A method for forming the semiconductor layer other than the step of forming the semiconductor layer is not particularly limited and may be appropriately selected depending on the intended purpose. Examples thereof include: a method for forming the semiconductor layer by forming a film through, for example, a vacuum process (e.g., a pulse laser deposition (PLD) method, a chemical vapor deposition (CVD) method, and an atomic layer deposition (ALD) method) or a solution process (e.g., dip coating, spin coating, and die coating) and then patterning the film through photolithography; and a method for forming the semiconductor layer by directly forming a film having a desired pattern through the printing process, such as inkjet printing, nanoimprinting, or gravure printing.

An average film thickness of the semiconductor layer is not particularly limited and may be appropriately selected depending on the intended purpose. However, the average film thickness thereof is preferably from 5 nm through 1 μm, more preferably from 10 nm through 0.5 μm.

<<Gate Insulating Film>>

The gate insulating film is disposed between, for example, the gate electrode and the semiconductor layer.

The gate insulating film is formed through the gate insulating film forming step.

An average film thickness of the gate insulating film is not particularly limited and may be appropriately selected depending on the intended purpose. However, the average film thickness thereof is preferably from 50 nm through 3 μm, more preferably from 100 nm through 1 μm.

A structure of the field-effect transistor is not particularly limited and may be appropriately selected depending on the intended purpose. Examples thereof include field-effect transistors having the following structures.

(1) A field-effect transistor including; a substrate; the gate electrode formed on the substrate; the gate insulating film formed on the gate electrode; the source electrode and the drain electrode formed on the gate insulating film; and the semiconductor layer formed between the source electrode and the drain electrode.

(2) A field-effect transistor including; a substrate; the source electrode and the drain electrode formed on the substrate; the semiconductor layer formed between the source electrode and the drain electrode; the gate insulating film formed on the source electrode, the drain electrode, and the semiconductor layer; and the gate electrode formed on the gate insulating film.

Figure 2:
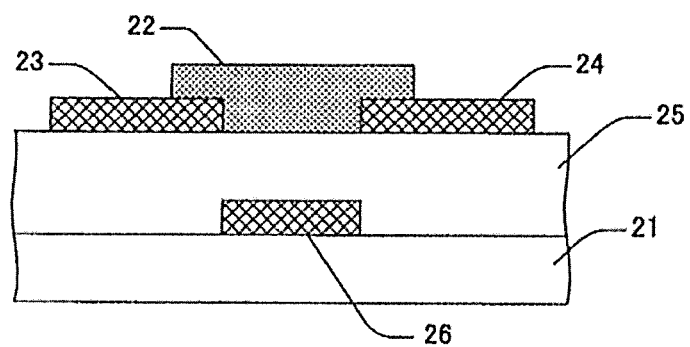
FIG. 2 is a schematic cross-sectional view presenting one example of a bottom contact-bottom gate field-effect transistor.

Examples of the field-effect transistor having the structure described in the (1) include a top contact-bottom gate field-effect transistor (FIG. 1) and a bottom contact-bottom gate field-effect transistor (FIG. 2).

Figure 3:
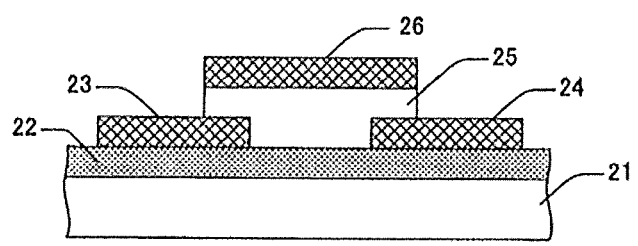
FIG. 3 is a schematic cross-sectional view presenting one example of a top contact-top gate field-effect transistor.
Figure 4:
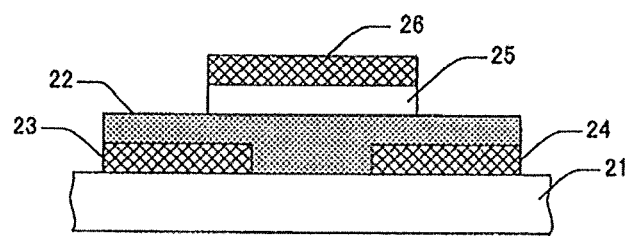
FIG. 4 is a schematic cross-sectional view presenting one example of a bottom contact-top gate field-effect transistor.

Examples of the field-effect transistor having the structure described in the (2) include a top contact-top gate field-effect transistor (FIG. 3) and a bottom contact-top gate field-effect transistor (FIG. 4).

Here, in FIG. 1 to FIG. 4, the reference numeral 21 represents a substrate, the reference numeral 22 represents a semiconductor layer, the reference numeral 23 represents a source electrode, the reference numeral 24 represents a drain electrode, the reference numeral 25 represents a gate insulating film, and the reference numeral 26 represents a gate electrode.

EXAMPLES

The present disclosure will next be described by way of Examples, but the present disclosure should not be construed as being limited to the following Examples.

Comparative Examples 1 and 2, and Examples 1 to 9

<Preparation of Target>

Raw material powders were weighed so as to be a molar ratio described in Table 1 and were mixed. Then, the resultant was ground using a ball mill and was subjected to hot press for 2 hours under the conditions of 1500° C. and 300 kgf/cm$^2$ to thereby form a sintered body. The sintered body was subjected to machine processing and was bound to a backing plate of Cu to thereby obtain a sputtering target.

The target was left to stand for one week in an atmosphere of 22±2° C. and 45±10% RH. After that, whether powder was formed on the surface of the target was visually observed. Results are presented in Table 1.

<Measurement of Dielectric Constant of Insulating Oxide Film>

On an alkali-free glass substrate, 100 nm of Al as a bottom electrode was deposited through a mask. The sputtering target described in Table 1, which had been prepared as described above, was used to form 100 nm of an insulating oxide film thereon through the RF magnetron sputtering method. During the sputtering, argon and oxygen were introduced into a chamber as process gas. An oxygen flow rate was 20%, and a sputtering pressure was 0.25 Pa. Moreover, 100 nm of Al as an upper electrode was deposited through a mask. The thus-formed capacitor structure was used to measure a relative dielectric constant c of the insulating film Values of the relative dielectric constant at 1 MHz are presented in Table 1.

Note that, immediately after preparation of the lanthanum oxide sputtering target of Comparative Example 1, powder was formed on the surface thereof. Therefore, normal electric discharge could not be performed and thus the insulating film could not be formed.

TABLE 1

| | Raw material powder | | | Ratio at the time of mixing raw material powders (molar ratio) | Left to stand for one week Bad: Powder was formed. Good: Powder was not formed. | Relative dielectric constant (∈) of oxide film | Electric field at the time of dielectric breakdown [MV/cm] |
|---|---|---|---|---|---|---|---|
| | Raw material 1 | Raw material 2 | Raw material 3 | | | | |
| Comparative Example 1 | La$_2$O$_3$ | | | (Only La) | Bad | Film was not formed. | |
| Comparative Example 2 | La$_2$O$_3$ | MgO | | La:Mg = 38:62 | Good | 6.0 | 2.8 |
| Example 1 | La$_2$O$_3$ | MgO | | La:Mg = 95:5 | Good | 9.6 | 4.1 |
| Example 2 | La$_2$O$_3$ | MgO | | La:Mg = 90:10 | Good | 9.0 | 4.2 |
| Example 3 | La$_2$O$_3$ | CaO | | La:Ca = 80:20 | Good | 9.5 | 4.0 |
| Example 4 | La$_2$O$_3$ | BaCO$_3$ | Al$_2$O$_3$ | La:Ba:Al = 80:10:10 | Good | 16.0 | 4.6 |
| Example 5 | La$_2$O$_3$ | SrCO$_3$ | Ta$_2$O$_5$ | La:Sr:Ta = 55:5:40 | Good | 16.0 | 4.3 |
| Example 6 | La$_2$O$_3$ | SrCO$_3$ | ZrO$_2$ | La:Sr:Zr = 55:5:40 | Good | 12.0 | 4.3 |
| Example 7 | La$_2$O$_3$ | CaO | ZrO$_2$ | La:Ca:Zr = 40:30:30 | Good | 10.4 | 4.4 |
| Example 8 | La$_2$O$_3$ | CaO SrCO$_3$ | | La:Ca:Sr = 40:30:30 | Good | 9.1 | 4.5 |
| Example 9 | La$_2$O$_3$ | MgO CaO SrCO$_3$ | | La:Mg:Ca:Sr = 40:20:20:20 | Good | 9.2 | 5.0 |

In Comparative Example 2, the relative dielectric constant was small and the resistance to voltage was low, because Comparative Example 2 did not satisfy the condition that lanthanum has the highest molar ratio among elements other than oxygen contained in the sintered body.

Aspects of the present disclosure are as follows, for example.

<1> A sputtering target for an insulating oxide film, the sputtering target including a sintered body including a lanthanum oxide and at least one selected from the group consisting of a beryllium oxide, a magnesium oxide, a calcium oxide, a strontium oxide, and a barium oxide, wherein lanthanum has highest molar ratio among elements other than oxygen contained in the sintered body.

<2> The sputtering target for an insulating oxide film according to <1>, wherein the sintered body further includes at least one selected from the group consisting of an aluminum oxide, a titanium oxide, a zirconium oxide, a hafnium oxide, a niobium oxide, and a tantalum oxide.

<3> The sputtering target for an insulating oxide film according to <1> or <2>, wherein a ratio of moles of lanthanum to a total of moles of the elements other than oxygen contained in the sintered body is 95% or less.

<4> The sputtering target for an insulating oxide film according to any one of <1> to <3>, wherein a ratio of moles of lanthanum to a total of moles of the elements other than oxygen contained in the sintered body is 40% or more.

<5> A method for forming an insulating oxide film, the method including forming the insulating oxide film through a sputtering method using the sputtering target for an insulating oxide film according to any one of <1> to <4>.

<6> The method for forming an insulating oxide film according to <5>, wherein the insulating oxide film is formed by disposing the sputtering target for an insulating oxide film in a vacuum chamber, introducing, into the vacuum chamber, sputtering gas that includes oxygen and argon and satisfies an oxygen flow ratio of $0\% < O_2/(Ar+O_2) \leq 90\%$, and sputtering the sputtering target for an insulating oxide film with plasma of the sputtering gas.

<7> A method for producing a field-effect transistor including a gate insulating film, the method including forming the gate insulating film formed of an insulating oxide film through the method for forming an insulating oxide film according to <5> or <6>.

<8> The method for producing a field-effect transistor according to <7>, the field-effect transistor including a semiconductor layer, and the method further including forming the semiconductor layer formed of an oxide semiconductor through a sputtering method, wherein, in the forming the gate insulating film, the gate insulating film is formed on the semiconductor layer, and after the forming the semiconductor layer, the forming the gate insulating film is performed without exposing the semiconductor layer to an atmosphere.

<9> The method for producing a field-effect transistor according to <7>, the field-effect transistor including a semiconductor layer, and the method further including forming the semiconductor layer formed of an oxide semiconductor on the gate insulating film through a sputtering method, wherein after the forming the gate insulating film, the forming the semiconductor layer is performed without exposing the gate insulating film to an atmosphere.

According to the sputtering targets for an insulating oxide film according to <1> to <4>, it is possible to form an insulating oxide film having a high dielectric constant and an excellent insulating property and to provide a sputtering target for an insulating oxide film hardly forming powder.

According to the methods for forming an insulating oxide film according to <5> and <6>, it is possible to provide a method for forming an insulating oxide film capable of forming an insulating oxide film having a high dielectric constant and an excellent insulating property.

According to the methods for producing a field-effect transistor according to <7> to <9>, it is possible to provide a method for producing a field-effect transistor including, as a gate insulating film, an insulating oxide film having a high dielectric constant and an excellent insulating property.

What is claimed is:

1. A field-effect transistor including a gate insulating film formed of an insulating metal oxide film through a sputtering method using a sputtering target for the insulating oxide film, the sputtering target comprising
    a sintered body including a lanthanum oxide and at least one selected from the group consisting of a beryllium oxide, a magnesium oxide, a calcium oxide, a strontium oxide, and a barium oxide,
    wherein lanthanum has highest molar ratio among elements other than oxygen contained in the sintered body of the sputtering target for the insulating oxide film, and
    the insulating metal oxide film is formed by disposing the sputtering target for the insulating metal oxide film in a vacuum chamber, introducing, into the vacuum chamber, sputtering gas that includes oxygen and argon and satisfies an oxygen flow ratio of $0\% < O_2/(Ar+O_2) < 90$, and sputtering the sputtering target for the insulating metal oxide film with plasma of the sputtering gas.

2. The field-effect transistor according to claim 1, wherein the sintered body further includes at least one selected from the group consisting of an aluminum oxide, a titanium oxide, a zirconium oxide, a hafnium oxide, a niobium oxide, and a tantalum oxide.

3. The field-effect transistor according to claim 1, wherein a ratio of moles of lanthanum to a total of moles of the elements other than oxygen contained in the sintered body is 95% or less.

4. The field-effect transistor according to claim 1, wherein a ratio of moles of lanthanum to a total of moles of the elements other than oxygen contained in the sintered body is 40% or more.

* * * * *